United States Patent
Bruce et al.

(10) Patent No.: US 8,904,954 B2
(45) Date of Patent: Dec. 9, 2014

(54) METHOD OF APPLYING AN ELECTRIC CONDUCTIVE LAYER TO SELECTED PORTIONS OF A MOUNTING FRAME

(71) Applicant: PPG Industries Ohio, Inc., Cleveland, OH (US)

(72) Inventors: Mitchell V. Bruce, Wheeling, WV (US); Brian L. Smith, Brunswick, OH (US); Thomas R. Scarniac, Avon, OH (US)

(73) Assignee: PPG Industries Ohio, Inc., Cleveland, OH (US)

( * ) Notice: Subject to any disclaimer, the term of this patent is extended or adjusted under 35 U.S.C. 154(b) by 99 days.

(21) Appl. No.: 13/665,043

(22) Filed: Oct. 31, 2012

(65) Prior Publication Data
US 2013/0055951 A1 Mar. 7, 2013

Related U.S. Application Data

(62) Division of application No. 13/352,456, filed on Jan. 18, 2012, now Pat. No. 8,313,817, which is a division of application No. 12/402,709, filed on Mar. 12, 2009, now Pat. No. 8,105,646.

(51) Int. Cl.
*B05C 11/00* (2006.01)
*B05C 21/00* (2006.01)
*B64C 1/14* (2006.01)
*H05K 9/00* (2006.01)
*B05B 15/04* (2006.01)

(52) U.S. Cl.
CPC ............ *H05K 9/0005* (2013.01); *B64C 1/1492* (2013.01); *B05B 15/0462* (2013.01)
USPC .............. 118/504; 427/58; 427/162; 427/259

(58) Field of Classification Search
CPC . B05B 15/0462; B64C 1/1492; H05K 9/0005
USPC ................................... 118/504, 505; 427/301
See application file for complete search history.

(56) References Cited

U.S. PATENT DOCUMENTS 4,844,285 A * 7/1989 Horiki et al. .................. 220/287

* cited by examiner

*Primary Examiner* — Alexander Weddle
(74) *Attorney, Agent, or Firm* — Andrew C. Siminerio

(57) ABSTRACT

A foam mount of an aircraft window has a groove to receive an electro chromic window. The foam mount is painted by placing a blank in the groove to divide the foam mount into a first section designated to face the exterior of the aircraft and an opposite second section. The foam mount having the blank is placed in a mask or masking device to coat one section of the foam mount while covering the other section. The groove and the first section are coated with an electric conductive paint, and the second section is covered with a decorative paint. The conductive coating on the foam mount and the conductive coating of the electrodes of the electro chromic window provide an RF shielding to prevent electronic signals from personal electronic equipment from passing through the cabin and door windows of the aircraft.

13 Claims, 6 Drawing Sheets

METHOD OF APPLYING AN ELECTRIC CONDUCTIVE LAYER TO SELECTED PORTIONS OF A MOUNTING FRAME

CROSS-REFERENCE TO RELATED APPLICATIONS

This application is a divisional of U.S. application Ser. No. 13/352,456 filed Jan. 18, 2012, now U.S. Pat. No. 8,313,817, which is a divisional of Ser. No. 12/402,709 filed Mar. 12, 2009, now U.S. Pat. No. 8,105,645, issued Jan. 31, 2012, which applications in their entirety are hereby incorporated by reference.

BACKGROUND OF THE INVENTION

1. Field of the Invention

This invention relates to a method of applying an electric conductive layer to selected portions of a mounting frame or foam mount, and to the foam mount, and more particularly, to applying the electric conductive layer to inner surface of one side of the foam mount, and applying a non-electric conductive layer to inner surface of opposite side of the foam mount. The invention further relates to a mask or a masking device that can be used in the practice of the non-limiting embodiments of the method of the invention.

2. Discussion of the Technical Problem

At the present time there is a desire to provide electronic shielding around the body of commercial aircrafts such that electronic signals to and from electronic equipment of the passengers, e.g. cell phones and computers within the commercial aircraft, are only transmitted by and received through the antenna of the aircraft. One of the advantages of this arrangement is the elimination of uncontrolled transmission of signals through the windows of the aircraft, which transmitted signals can interfere with transmitted signals required to operate the aircraft. As is appreciated by those skilled in the art, to attain this goal it becomes necessary to prevent transmission of the signals through the cabin windows and through the door windows of the aircraft.

In one approach to accomplish this goal, a window pane having an electric conductive layer is mounted in a foam mount having an electric conductive layer. The window pane can be an electro-chromic window, or one or more glass sheets having an electric conductive layer or film over the major surface of one or more of the sheets. More particularly and as is known in the art, the electro chromic window includes an electro chromic medium between two spaced electrodes. Each of the electrodes include an electric conductive layer or film on a major surface of a glass sheet. The electric conductive layer or film provides a radio frequency ("RF") shielding.

The outboard surface of the foam mount has an electric conductive layer, e.g. an RF shielding layer or coating. The inboard surface of the foam mount is coated with a non-electrical conductive decorative paint to compliment the décor of the aircraft interior. The foam mount having the window pane is positioned in the window opening of the aircraft between an outboard structural ply and an inboard protective overlay sheet. The conductive layer on the foam mount is electrically connected with the aircraft wall to connect the electric conductive layer of the foam mount to the electric ground of the aircraft. With this arrangement, the electric conductive layers of the electro-chromic window and the electric conductive layer of the foam mount provide an RF shielding over the window opening in the body of the aircraft.

As is appreciated by those skilled in the art, applying two different layers, or coatings on a foam mount can be time consuming and labor intensive. It would be advantages, therefore, to provide a method of coating selected portions of a foam mount with an electric conductive layer, and other selected portions of the foam mount with a non-electric conductive decorative layer that minimizes the time and the labor to apply the two layers to a foam mount.

SUMMARY OF THE INVENTION

This invention relates to a method of applying an electric conductive layer to selected portions of a foam mount; the foam mount in a shape having an enclosed frame surrounding an open area. The frame in cross section includes, among other things, a peripheral surface; an inner surface opposite to the peripheral surface, the inner surface defining the open area; a first side extending from the peripheral surface to first portion of the inner surface, and an opposite second side extending from the peripheral surface to second portion of the inner surface, wherein the inner surface of the foam mount includes open end of a groove facing the open area of the foam mount and the first portion is on one side of the open end of the groove and the second portion is on the other side of the open end of the groove. The method includes, among other things, applying a first electric conductive coating over inner surfaces of the groove; inserting peripheral edge of a substrate in the groove to completely cover the open area of the foam mount to separate the foam mount into a first section and a second section. The first section includes the first side of the foam mount and a portion of the inner surface connected to the first side defined as a first portion, and the second half includes the second side of the foam mount, and a portion of the inner surface connected to the second side defined as a second portion. A second electric conductive coating is applied over the first section, wherein the coating on the first section and the coating on the inner surface of the groove contact one another, and a non-electric conductive coating is applied over the second section of the foam mount.

Further, this invention relates to a method of making an RF shielded window by, among other things, providing a foam mount in a shape having an enclosed frame surrounding an open area, the frame in cross section having, among other things, a peripheral surface; an inner surface opposite to the peripheral surface, the inner surface defining the open area; a first side extending from the peripheral surface to first portion of the inner surface, and an opposite second side extending from the peripheral surface to second portion of the inner surface, wherein the inner surface of the foam mount includes open end of a groove facing the open area of the foam mount, and the first portion is on one side of the open end of the groove and the second portion is on the other side of the open end of the groove. A transparency having an electric conductive layer over a major surface of the transparency is shaped and sized to fit within the groove of the foam mount and completely cover the open area of the foam mount. A substrate having a peripheral shape and a thickness similar to peripheral shape and thickness of the transparency is provided. A first electric conductive coating is applied over inner surfaces of the groove, afterward, peripheral edge of the substrate is inserted in the groove to completely cover the open area of the foam mount and to separate the foam mount into a first section and a second section. The first section includes the first side and a portion the inner surface connected to the first side defined as a first portion, and the second half includes the second side, and a portion of the inner surface connected to the second side defined as a second portion. A second electric conductive coating is applied over the first section, wherein the second coating on the first section of the foam mount and the first coating on the inner surfaces of the groove contact one another. A non-electric conductive coating is applied over the second section of the foam mount. The substrate is removed from the foam mount, and the transparency is placed in the groove of the foam mount.

Still further, this invention relates to an aircraft window mounted in a foam mount made by the above methods.

In addition, this invention relates to a coating mask or a masking device for exposing a major surface of a window mount for painting while preventing other surfaces of the window mount from being painted, the masking device includes, among other things, a support plate having a first surface and a perimeter; a plurality of upright pins having a first end and an opposite second end, wherein the first end of the plurality of upright pins are mounted in the first surface of the support plate with the second end of the upright pins extending away from the first surface of the support plate and the plurality of vertical support posts spaced from the perimeter of the support plate and spaced from one another, and a frame member having a place member completely surrounding an open area, wherein the plate member is supported on the second end of the plurality of upright pins, wherein with the window mount positioned within the plurality of upright pins and the plate member of the frame member positioned on the second end of the plurality of upright pins, a paint spray passing through the open area of the frame member sprays paint on the major surface of the window mount facing the open area of the frame member and passes through the space between the plurality of upright pins to prevent overspray of the other surfaces of the window mount from being painted.

DESCRIPTION OF THE INVENTION

Figure 1:
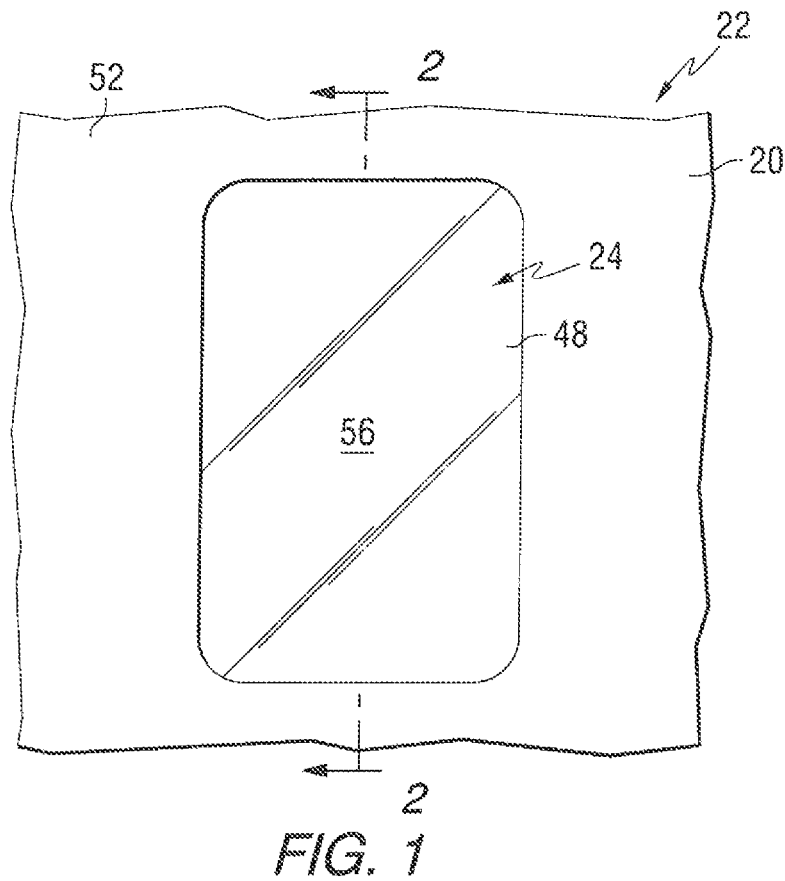
FIG. 1 is a fragmented side view of an aircraft showing outboard view of a cabin window.

As used herein, spatial or directional terms, such as "inner", "outer", "left", "right", "up", "down", "horizontal", "vertical", and the like, relate to the invention as it is shown in the drawing figures. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 6.7, or 3.2 to 8.1, or 5.5 to 10. Also, as used herein, the terms "sprayed over", "applied over", or "provided over" mean sprayed, applied, or provided on but not necessarily in surface contact with. For example, a material "applied over" a substrate does not preclude the presence of one or more other materials of the same or different composition located between the deposited material and the substrate.

Before discussing non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise in the following discussion, like numbers refer to like elements.

Non-limiting embodiments of the invention will be directed to the practice of the invention to make a cabin window of an aircraft; the invention, however, is not limited to any particular type of aircraft cabin window, and the invention contemplates the practice of the invention on door windows of an aircraft. Further, the invention can be practiced on windows for commercial and residential buildings, e.g. but not limited to type disclosed in U.S. Pat. No. 5,675,944, which patent in its entirety is hereby incorporated by reference; on a window for any type of vehicle; e.g. air and space vehicles, and above or below water vessels, and on a window for a viewing side or door for any type of containers, for example but not limited to a refrigerator, cabinet and/or oven door.

Figure 2:
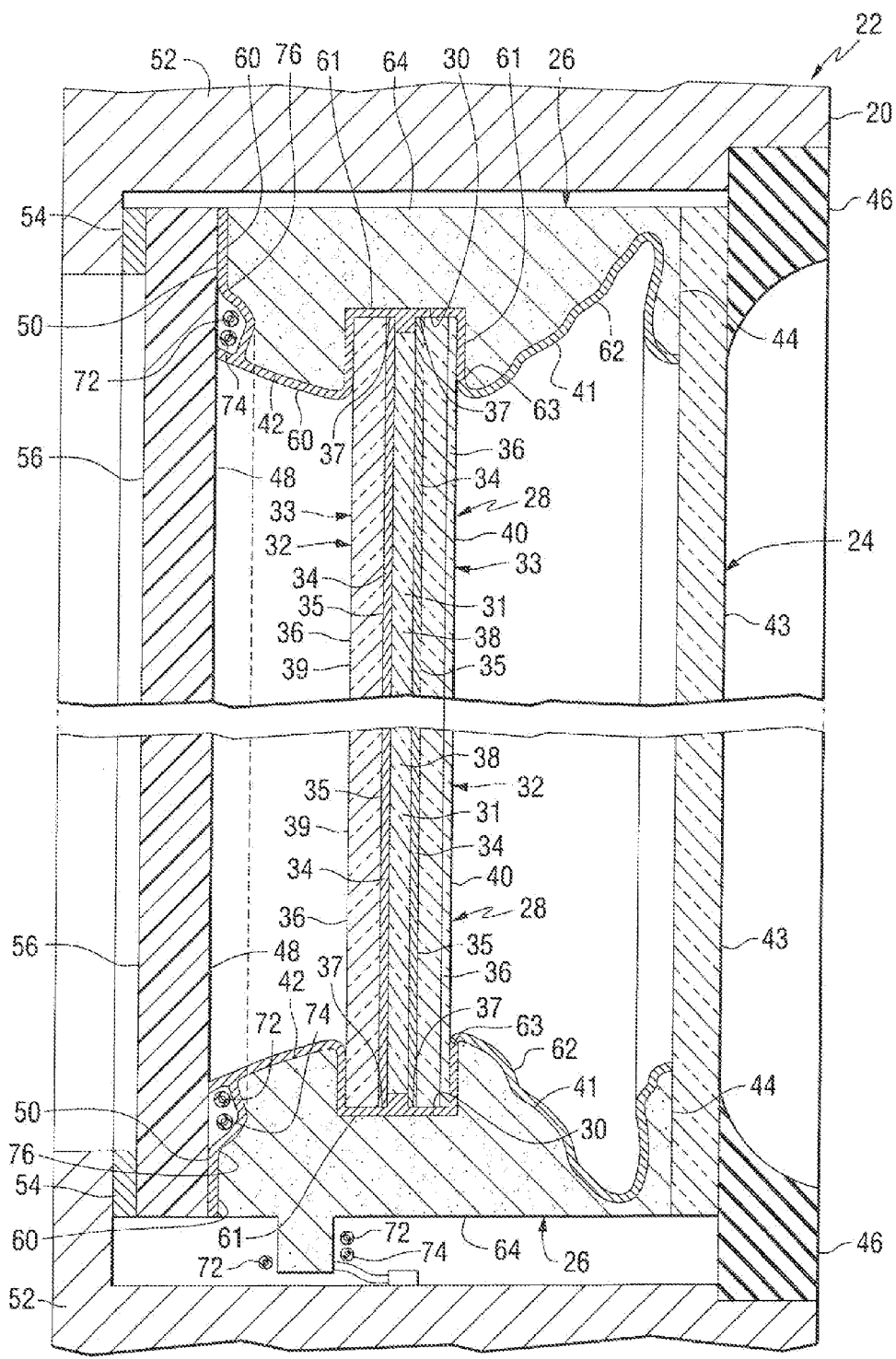
FIG. 2. Is a view taken along lines 2-2 of FIG. 1.

With reference to FIGS. 1 and 2 as needed, a section 20 of an aircraft 22 has a cabin window 24. The cabin window 24 (see FIG. 2) includes a frame mount 26, which includes features of the invention and is coated according to the invention. In the preferred practice of the invention the frame mount 26 is made of foam and will hereinafter also be referred to as "frame mount" or "foam mount". A pane 28, e.g. an electro-chromic window 28 is mounted in a groove 30 of the foam mount 26. The electro-chromic window 28 includes an electro-chromic medium 31 between a pair of electrodes 32 and 33. Each of the electrodes 32 and 33 includes an electric conductive layer or film 34 on inner surface 35 of a glass sheet 36. The marginal edges 37 of the sheets 36 of the electrodes 32 and 33 are sealed to provide a sealed cell 38 having the electro-chromic medium 31. Outer surface 39 of the glass sheet 36 of the electrode 32 faces the exterior of the aircraft 22, and outer surface 40 of the glass sheet 36 of the electrode 33 faces the interior of the aircraft 22. Electro-chromic windows are well known in the art and no further discussion of the construction of the electro-chromic window 24 is deemed necessary.

The electro conductive film 34 of the electrodes 32 and 33 provides an RF shielding to prevent transmission of electric signals through the pane 28. The inboard inner surface 41 of the foam mount 26 faces the interior of the aircraft 22, and outboard inner surface 42 of the foam mount 26 faces the exterior of the aircraft 22. An inboard protective overlay sheet 43 is between inboard side 44 of the foam mount 26 and interior window frame 46, and a structural ply 48 is between outboard side 50 of the foam mount 26 and body 52 of the aircraft 22. Optionally a gasket 54 is provided between outboard surface 56 of the structural ply 48 and the body 52 of the aircraft 22 to minimize, if not eliminate, the ingress of moisture between the aircraft body 52 and the structural ply 48.

The invention is not limited to the manner in which, or the components used, to securely mount the cabin window 24 in the aircraft body 52, and any of the techniques or fasteners, e.g. bolts, nuts, screws, caps and latches known in the art can be used in the practice of the invention to secure the cabin window 24 to the aircraft body. As is appreciated by those skilled in the art, the manner of using the fasteners, and the type of fasteners used, to secure the cabin window to the aircraft body 52 is dictated by the designer and/or builder of the aircraft and is therefore not limiting to the invention. Further, the invention contemplates unitizing the components of the cabin window, e.g. the structural ply 48, the foam mount 26 having the pane 28, and the inboard protective layer 24, and securing the unitized cabin window in the aircraft body 52, and thereafter securing the inboard window frame 46 to the aircraft body. The invention also contemplates individually mounting and securing the components of the cabin window 24 in the aircraft body 52, e.g. securing the structural ply 56 and gasket 54, if used, in position; securing the frame mount 26 having the pane 28 in position against the structural ply 48, and securing the inboard protective sheet 42 in position against the frame mount 26, and thereafter, securing the inboard window frame 46 to the aircraft body.

The structural ply 48 is not limiting to the invention and can be a single glass or plastic sheet, or a pair of glass and plastic sheets, and combinations thereof laminated together by a interlayer material as is known in the art, e.g. as described in U.S. Patent Application Publication 2007/0002422A1. When the sheets are made of glass, the glass is preferably chemically tempered, heat tempered or heat strengthen. The materials of the sheets and the number of sheets of the structural ply 48 is not limiting to the invention.

The inboard protective overly sheet 43 is not limiting to the invention and can be any of the types used in the art, e.g. a plastic sheet to protect the underlying pane 28 from surface scratches caused by passenger curiosity, cleaning solutions, and/or abrasive cleaning materials.

In the preferred practice of the invention, the pane 28 is an electro chromic device or window 28 having the medium 31 changing percent of light transmission as a function of changes in voltage applied to the medium. The invention is not limited to the construction of the electro chromic window and any of the types known in the art, e.g. U.S. Pat. Nos. 5,215,821; 6,471,360 and 6,783,099 and U.S. Patent Application Publication 2007/0002422A1 can be used in the practice of the invention. The invention also contemplates the pane 28 being a photo chromic device having a pair of glass sheets spaced from one another and a medium between the sheets that changes percent of light transmission as a function of light intensity on the medium. The invention is not limited to the construction of the photo chromic window and any of the types known in the art, e.g. U.S. Pat. Nos. 4,720,350; 5,973,039 and 7,393,101 can be used in the practice of the invention. The invention further contemplates the pane 28 being a glass or plastic sheet, or one or more glass or plastic sheets or combinations thereof, laminated together or spaced from one another by a spacer frame, e.g. of the type disclosed in U.S. Pat. No. 5,675,944. The above mentioned documents are hereby incorporated by reference.

As can now be appreciated by those skilled in the art, the invention contemplates the window 28 having an electric conductive layer or film on at least one of the major surfaces of the window to act as an RF shielding. For example and not limiting to the invention, in the instance when the window 28 is a photo chromic window, an electric conductive layer or film is provided on the outer surface of a sheet, or the inner surface of a sheet, e.g. the surface 35 of the glass sheet 36 of the electrode 32 and/or 33.

In another non-limiting embodiment of the invention, the pane 28 includes a substrate, e.g. a glass or plastic sheet having an electrically conductive layer or film over a major surface of the substrate. The electric conductive layer or film, e.g. the electric conductive layer 34 of the electrodes 32 and 33 of the pane 28 (see FIG. 2) provides a barrier to the transmission of electronic signals, e.g. but not limited to signals received and transmitted by electronic equipment, e.g. but not limited to cell phones and wireless computers. The invention is not limited to the conductive layer 36, and the layer can be any of the types known in the art. Non-limiting embodiments of conductive coatings that can be used in the practice of the invention include, but are not limited to, a pyrolytic deposited fluorine doped tin oxide film of the type sold by PPG Industries, Inc. under the registered trademark NESA®; a magnetron sputter deposited tin doped indium oxide film of the type sold by PPG Industries; Inc under the registered trademark NESATRON®; a coating made up of one or more magnetron sputter deposited films, the films including, but not limited to a metal film, e.g. silver between metal oxide films (dielectric films), e.g. zinc oxide and/or zinc stannate, each of which may be applied sequentially by magnetron sputtering, e.g. as disclosed in U.S. Pat. Nos. 4,610,771; 4,806,220 and 5,821,001, the disclosures of which are hereby incorporated by reference.

The foam mount 26 can be made of any material that is compressible, flexible and is electrically non-conductive. The material is preferably compressible and flexible so that the pane 28 can be mounted in the groove 30 of the foam mount 26. The foam mount 26 is electrically non-conductive in order that only selected surface portions of the foam mount can be made electrically conductive by an application of an electrically conductive coating. More particularly and with reference to FIGS. 2 and 3 as needed, in one non-limiting embodiment of the invention, an electrically conductive layer or coating 60 is applied or provided over inner walls 61 of the groove 30, the outboard side 50, and the outboard inner surface 42 of the foam mount 26, and a decorative coating 62, preferably a non-electric conductive coating, is applied or provided over the inboard inner surface 41 of the foam mount 26. Outer peripheral surface 64 of the foam mount 26 is not intentionally covered with either the conductive coating 62, or with the decorative coating 62, because the outer surface 64 of the foam mount 26 is not visible when viewing through the cabin window and not coating the surface 64 realizes a reduction in the cost of the coatings; however, overspray or over paint onto the outer surface 64 of the foam mount is acceptable. In one non-limiting embodiment of the invention, the invention was practiced on Zote Foam mounts made by Technifab, Inc having an office in Avon, Ohio.

Figure 3:
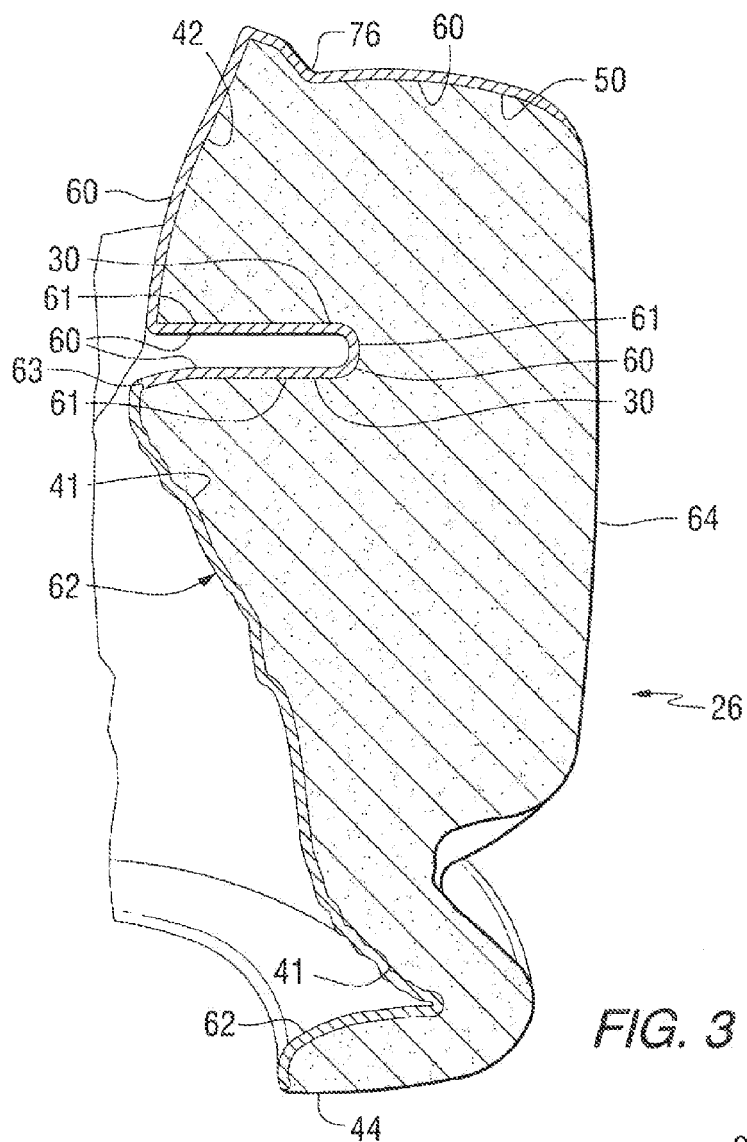
FIG. 3 is a cross sectional view of the foam mount shown in FIG. 2.

In the practice of the invention, the foam mount 26 is coated with the electric conductive layers 60 and 61 to prevent electronic signals from moving through the foam mount. The inboard inner surface 38 of the foam mount is painted with a decorative paint for aesthetic reasons. With reference to FIG. 3, interface 63 is the end of the conductive layer 61 and the beginning of the decorative coating 62. As is appreciated, the invention is not limited to the location of the interface 63; however, the conductive layers 60 and 61 and the conductive layer of the pane 28 should provide an RF shielding without any gaps or separations between the conductive layers 60 and 61 of the foam mount and conductive layer of the pane 28. Further, as is appreciated, the invention is not limited to the types of paint used in the practice of the invention. In one non-limiting embodiment of the invention, the electrically conductive coating 60 was 102-32/B507 Silver RF paint of the type sold by Creative Materials, and the decorative coating 62 was 1050 HF BAC70913 topcoat sold by HSH Interplan, Inc.

In one non-limiting embodiment of the invention, the foam mount was painted in the manner descried in PROCESS A.

Process A

Figure 4:
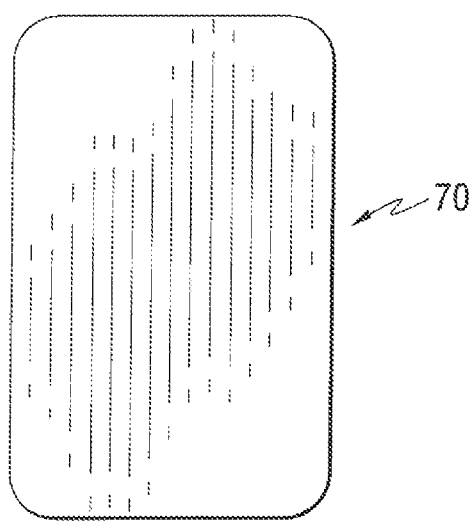
FIG. 4 is a plan elevated top view of a blank used in the practice of the invention to prevent coating overlap.

1. HSH Interplan, Inc. EED non-crazed cleaner for composites was applied to the inner walls 61 of the groove 30 of the foam mount 26 with a lint free Kimberly-Clark WypAII L30 wipe followed by a stream of low pressure compressed air to remove lint and foreign particles from the groove 30;
2. 102-32/8507 Silver RF paint (hereinafter also referred to as "Silver RF paint") was prepared per directions provided by the manufacturer of the Silver RF paint;
3. A paint stick or a swab was used to apply a layer 60 of the Silver RF paint to the inner walls 61 of the groove 30 of the foam mount 26 (see FIG. 3). Care was exercised not to apply any of the Sliver RF paint to the inboard inner surface 41 of the foam mount 26.
4. The layer 60 of the Silver RF paint applied over the inner walls 61 of the groove 30 was cured per instructions provided by the manufacturer of the Silver RF paint.
5. After the curing of the layer 60 of the Silver RF paint on the was of the groove, a blank 70 (see FIG. 4) having a shape similar to the shape of the pane 28 to be mounted in the groove 30 was provided. In one non-limited embodiment of the invention, the blank was a cardboard blank, however, the invention is not limited thereto, and the blank can be made of any material, e.g. but not limited to wood, metal, glass or plastic. The thickness of the blank 70 is not limiting to the invention, and the thickness is preferably 80-90% of the thickness of the pane 28 to be mounted in the groove 30 of the foam mount 26 for the reason discussed below. As mentioned above, the blank 70 has a shape similar to the shape of the pane 28, however, in this non-limiting embodiment of the invention, the shape of the blank is 5-10% smaller than the shape of the pane 28 to be mounted in the groove 30. By providing a blank 70 that is thinner and smaller than the pane 28 to be mounted in the groove 30, the groove 30 of the foam mount 26 was not excessively flexed when the blank 70 was inserted in the groove 30 to partition the inboard inner surface 36, from the outboard inner surface 38, of the foam mount 26 to prevent coating overlap.
6. The layer 60 of the Silver RF paint was sprayed onto the outboard inner surface 42, and the outboard side 50, of the foam mount 26 (see FIG. 3). Care was taken not to spay the outer surface 64 of the foam mount, however, overspray of the Silver RF paint onto the outer surface 64 of the foam mount 26 was noted. In this non-limiting embodiment of the invention, overspray of the Silver RF paint onto the outer surface 64 is acceptable.
7. The layer 60 of the Silver RF paint on the outboard inner surface 42, and the outboard side 50, of the foam mount 26 was cured per directions provided by the manufacturer of the Silver RF paint. The blank 70 remained in the groove 30 of the foam mount during the curing of the Silver RF paint.
8. After the curing of the layer 60 of the Silver RF paint on the outboard inner surface 40, and the outboard side 50, of the foam mount 26 was completed, the inboard inner surface 41 of the foam mount 26 was cleaned using HSH Interplan, Inc. EED cleaner. Thereafter, HSH Interplan, Inc 1025 primer/sealer was painted on the inboard inner surface 41 of the foam mount 26. The sealer was cured in one of the following manners: heated at 95° Fahrenheit for 15 minutes or cured at room temperature for one hour. After the sealer was cured, the layer 62 of the decorative paint was sprayed over the sealer. Care was taken not to spay the sealer or the decorative paint on the outer surface 64 of the foam mount 26, however, overspray of the sealer and the decorative paint onto the outer surface 64 was noted. In this non-limiting embodiment of the invention, overspray of the sealer and the decorative paint onto the outer surface 64 of the foam mount 26 is acceptable.
9. The layer 62 of the decorative paint on the inboard inner surface 41 of the foam mount 26 was cured per directions provided by the manufacturer of the decorative paint.

The term "overspray" as used herein is defined as a coating or layer having a decreasing thickness as the distance from the coating area increases. In the practice of the invention, the overspray of the Silver RF paint has a thickness that decreases as the distance from the intersection of the outboard side 50, and the outer surface 64, of the foam mount 26 increases (see FIG. 3), and the overspray of the Silver RF paint terminates short of the intersection of the inboard side 44, and the outer surface 64, of the foam mount 26. The overspray of the decorative paint 62 has a thickness that decreases as the distance from the intersection of the inboard side 44, and the outer surface 64, of the foam mount 26 increases (see FIG. 3), and the overspray of the decorative paint terminates short of the intersection of the outboard side 50, and the outer surface 64, of the foam mount 26. Further, the overspray of the decorative paint and the overspray of Silver RF paint preferably do not overlap.

After the layers or coatings applied to the foam mount were cured or dried, the blank 70 was removed and the electro chromic window 28 was mounted in the groove 30 of the foam mount 26. The conductive layer 60 on the foam mount 26 is electrically connected with the aircraft wall to connect the electric conductive layer of the foam mount to the electric ground of the aircraft. With this arrangement, the electric conductive layers of the window 28 and the electric conductive layer 60 of the foam mount 26 provide an RF shielding over the window opening in the body of the aircraft. Covering the walls 61 of the groove 30 of the foam mount assures that there is no break in the RF shield provided by the electrodes 32 and 33 of the pane 28 and the electric conductive layer 60 of the foam mount 26. With reference to FIG. 2, wires 72 (see FIG. 2) contacting the electrodes 32 and 33 of the pane 28 and wire 74 contacting the Silver RF paint 60 were arranged in groove 76 (see FIGS. 2 and 3) in the outboard side 50 of the foam mount 26 to meet at tab 78 formed on outer surface 64 of the foam mount 26. The wires were provided with connectors (not shown) to connect to the electro chromic window 28 and the layer 60 of the Silver RF paint to the electrical system of the aircraft 22.

As can now be appreciated, the practice of PROCESS A does not provide for the prevention of overspray onto the outer surface 64, and the inboard side 44, of the foam mount 26 (see FIG. 3). The invention contemplates preventing the painting or covering the outer surface 64, and/or the inboard side 44, of the foam mount 26 with the electric conductive layer 60 and the decorative paint layer 62, respectively. In one non-limiting embodiment of the invention, the decorative paint and the electrically conductive paint are applied with a paint brush or with a paint roller to prevent the covering of the outer surface 64, and the inboard side 44, of the foam mount 26. In another non-limiting embodiment of the invention, the foam mount 26 is positioned in a non-limiting embodiment of a mask or masking device designed to prevent or minimize the covering of the outer surface 64, and/or the inboard side 44, of the foam mount 26 with the conductive paint and the decorative paint, respectively.

Figure 5:
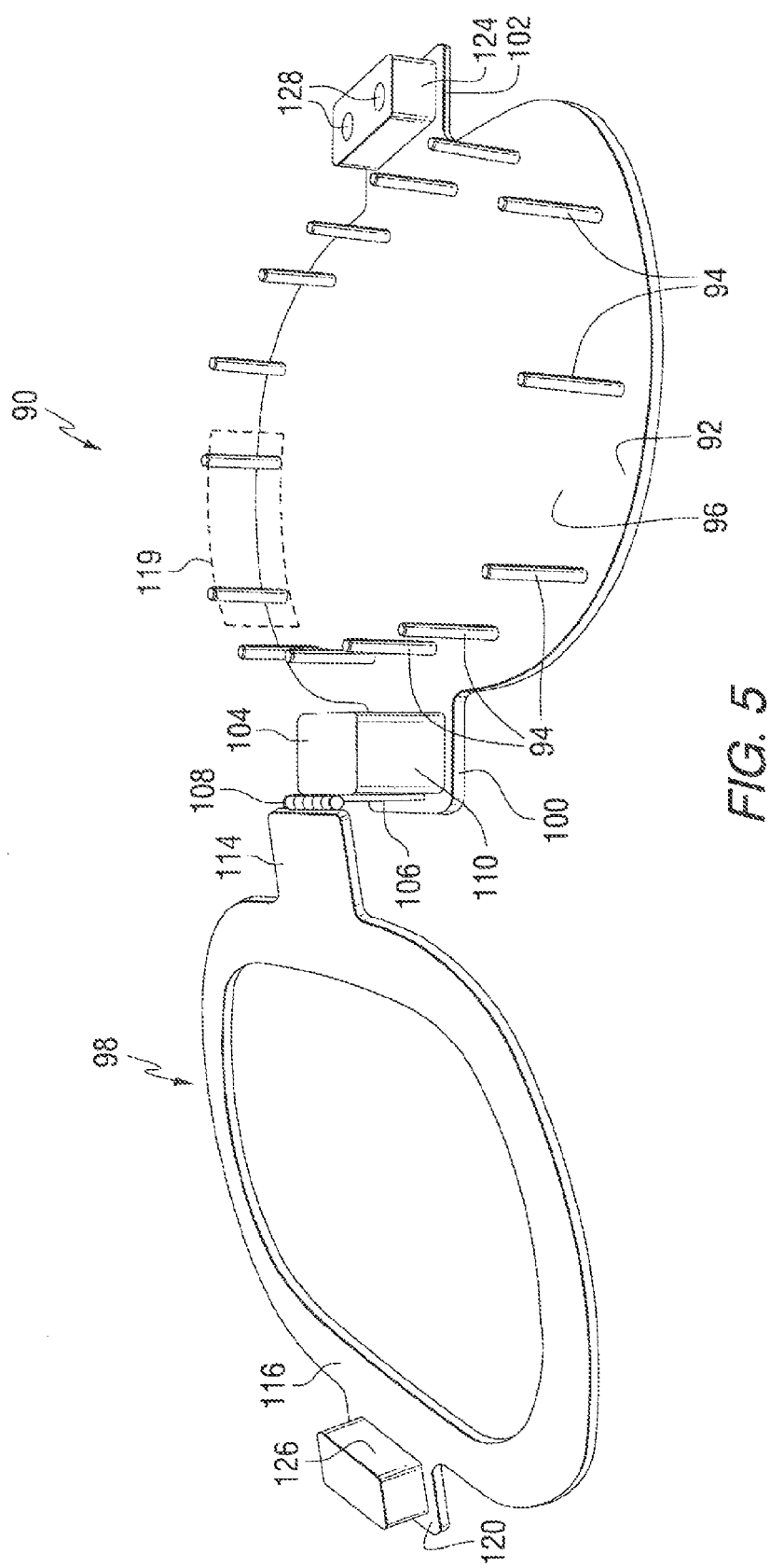
FIG. 5 is a prospective view of a mask or masking device in the open position; the mask can be used in the practice of the invention to prevent coating overlap.
Figure 6:
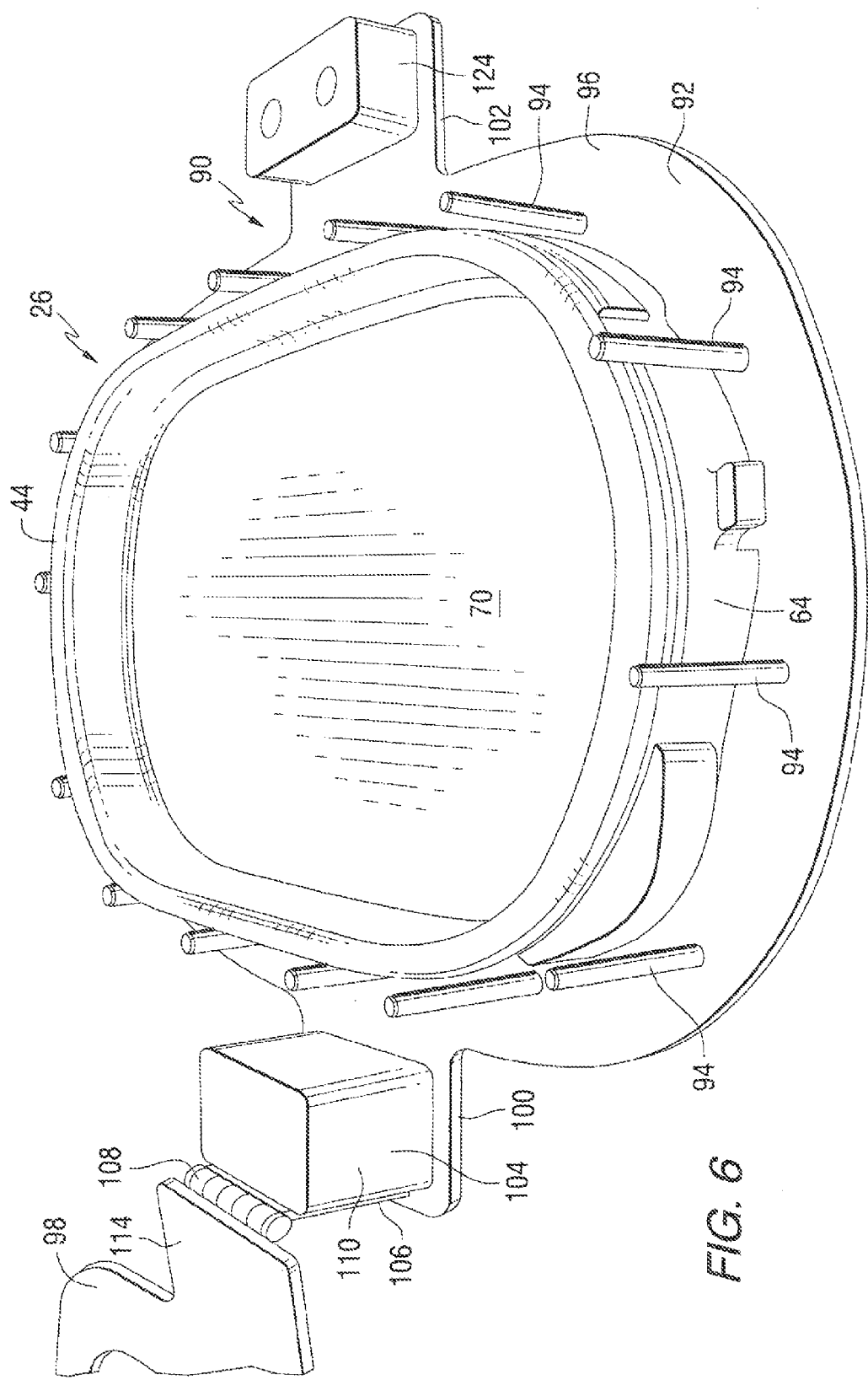
FIG. 6. Is a view similar to the view of FIG. 5 showing a foam mount positioned on the base of the mask.

With reference to FIG. 5, there is shown a non-limiting embodiment of a mask or masking device 90 of the invention to prevent or minimize the covering of the outer surface 64, and/or the inboard side 44, of the foam mount 26 with the conductive paint and/or the decorative paint, respectively. The mask 90 includes a base 92 having a plurality of spaced upright pins 94 secured on the base 92 in any convenient manner, and positioned on the base 92 to contain the foam mount 26 as shown in FIG. 6 and to prevent sideway motion of the foam mount 26 without compressing the outer surface 64 of the foam mount. The height of the pins 94 as measured from surface 96 of the base 92 of the mask 90 is equal to, or slightly greater, e.g. greater than 0 to 10% greater than the thickness of the foam mount 26 as measured between the outboard side 50 and the inboard side 44 (see FIG. 3) to avoid compression of the foam mount 26 when the mask cover 98 is positioned over the foam mount 26 and engages the pins 94. As can be appreciated, as the percent difference between the height of the pins 92 and the thickness of the foam mount 26 increases, the greater the probably of over spray of the conductive paint and the decorative paint passing through the space between the mask cover 98 and the foam mount 26, and depositing over the outside surface 64, and/or the inboard side 44, of the foam mount 26.

Figure 7:
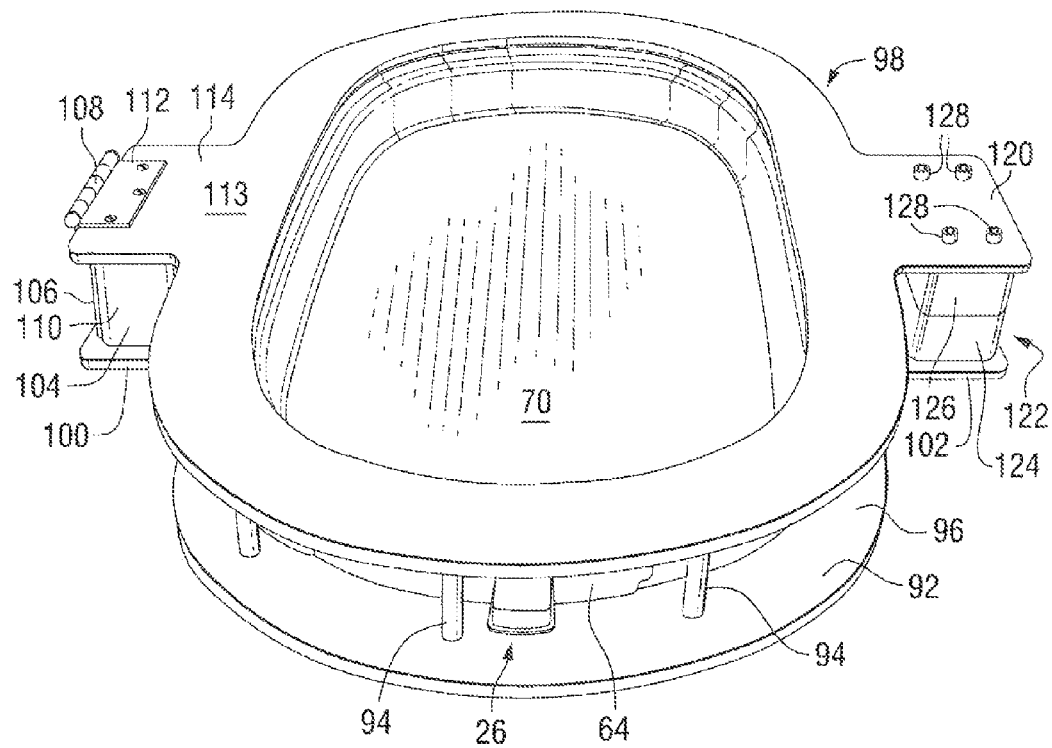
FIG. 7 is a view similar to the view of FIG. 6 showing the mask in the closed position.

With continued reference to FIG. 5, the base (hereinafter also referred to as the "mask base") 92 includes support plates 100 and 102. A shim 104 is secured to the support plate 100 in any convenient manner, e.g. by screws or welding. One plate 106 of a hinge 108 is secured to side 110 of the shim 104, and the other plate 112 of the hinge 108 is secured to outer surface 113 of the mask cover 98 at hinge support 114 (clearly shown in FIG. 7) so that inner surface 116 of the mask cover 98 and the surface 96 of the mask base 92 can be pivoted toward and away from one another to position the inner surface 116 of the mask cover 98 on the pins 94 (the mask cover 98 is shown in FIG. 7 in the closed position), and to move the inner surface 116 of the mask cover 98 away from the pins 94 toward the open position (the mask cover 98 shown in the open position in FIGS. 5 and 6). Preferably, but not limiting to the invention, the thickness of the shim 104 as measured between the inner surface 116 of the mask cover 98 and the surface 96 of the mask base 92 is equal to the height of the pins 94. As is appreciated, the invention contemplates a solid endless or continuous wall in place of the pins 94. A piece of the sold continuous wall 119 is shown only in FIG. 5 and shown only in phantom.

Figure 8:
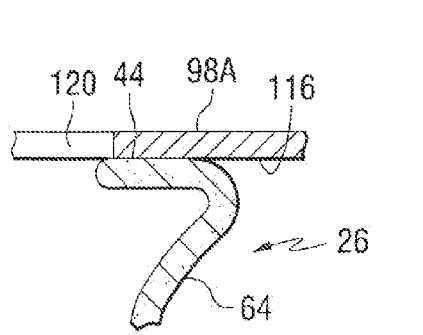
FIG. 8 is a fragmented side view of one non-limited embodiment of a mask cover of the mask or masking device on one side of the foam mount in accordance to the teachings of the invention.
Figure 9:
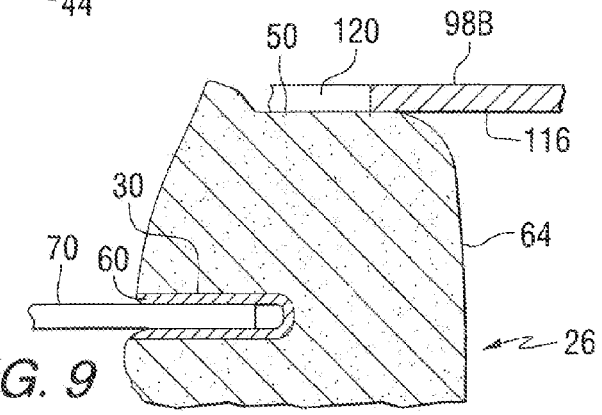
FIG. 9 is a view similar to the view of FIG. 8 showing another non-limited embodiment of a mask cover of the mask on the other side of the foam mount in accordance to the teachings of the invention.

With reference to FIG. 8, in one non-limiting embodiment of the invention, one mask cover 98A is provided with a cut out center portion 120 sized such that with the mask 90 in the closed position, the inner surface 116 of the mask cover 98A overlays the inboard side 44 of the foam mount 26. With reference to FIG. 9, in the non-limiting embodiment of the invention under discussion, another mask cover 98B is provided with a cut out center portion 120 sized such that with the mask 90 in the closed position, the inner surface 116 of the mask cover 986 overlays the outboard side 50 of the foam mount 26 adjacent the intersection of the outboard side 50, and the outer surface 64, of the foam mount 26 as shown in FIG. 9. As can be appreciated, when the cut out portions 120 are the same size, one size mask cover 98 can be used in the practice of the invention.

With reference to FIGS. 5-7 as needed, the mask cover 98 further includes a fastener support 120 that is aligned with the support 102 of the base 92 when the mask cover 98 is in the closed position (see FIG. 7). The mask cover 98 is preferably maintained in the closed position when the masks 90 are moved into and out of the cure chamber (not shown). The invention is not limited to the type of fastener 122 used in the practice of the invention to maintain the mask in the closed position. In one non-limiting embodiment of the invention, the fastener was a magnetic fastener 122 having magnetic bar 124 secured to the support plate 102 of the base 92 of the mask 90, and a magnetic bar 126 secured to fastener support 120 of the mask cover 98. The positive side of the magnetic bar 124 faces the magnetic bar 126, and the negative surface of the magnetic bar 126 faces the magnetic bar 124. The magnetic bars are secured to their respective support in any convenient manner, e.g. by screws 128 (see FIGS. 6 and 7). The thickness of the magnetic bars 124 and 126 as measured between the surface 96 of the mask base 92 and the inner surface 116 of the mask cover is equal to the thickness of the shim 104, or the height of the pins 94.

In another non-limiting embodiment of the invention, the mask or masking device 90 was used to apply the conductive layer 60 and the decorative layer 62 to selected portions of the foam mount 26 in the manner described in PROCESS B.

Process B

A. Steps 1-5 of PROCESS A were practiced.
B. The foam mount 26 having the blank 70 was placed within the pins 94 of the mask 90 (see FIG. 6) with the inboard side 44 of the foam mount 26 on the surface 96 of the base 92 of the mask 90. The mask cover 98B was positioned in the closed position such that the mask cover 98B overlaid a portion of the outboard side 50 of the foam mount 26 adjacent the intersection of the outboard side 50, and the outer surface 64, of the foam mount 26 (see FIG. 9).
C. The layer 60 of the Silver RF paint was sprayed onto the outboard inner surface 42, and the uncovered portion of the outboard side 50 of the foam mount 26 (see FIG. 9).
D. Step 7 of PROCESS A was practiced.
E. The inboard inner surface 41 of the foam mount 26 was cleaned as described in Step 8 of PROCESS A above.
F. The foam mount 26 having the blank 70 was placed within the pins 94 of the mask 90 (see FIG. 6) with the outboard side 50 of the foam mount 26 on the surface 96 of the base 92 of the mask 90. The mask cover 98A was positioned in the closed position such that the mask cover 98A overlaid the inboard side 44 of the foam mount 26 (see FIG. 8).

G. The sealer identified in Step 8 of PROCESS A was applied over the inboard inner surface 38 of the foam mount 26 and cured according to Step 8 of Process A.

H. After the sealer was cured, the layer 62 of the decorative paint was sprayed over the sealer to apply the decorative paint over the inboard inner surface 38 of the foam mount 26.

I. Step 9 of PROCESS A was practiced.

The mask cover 98A prevented overspray of the sealer and decorative coating 62 over the outer surface 64, and the outer surface 64, of the foam mount 26, and the mask cover 98B prevented overspray of the conductive coating 60 over the outer surface 64 of the foam mount 26. As is appreciate the invention is not limited to the sequence in which the inboard surfaces 44 and 50 of the foam mount 26 are painted.

After the groove 30, the inner surfaces 41 and 42, and the outboard side 50, of the foam mount 28 are covered, and the conductive paint and the decorative paint are cured, the blank 70 was removed and the electro chromic window 29 having the conductive layer 36 was mounted in the groove 30 of the foam mount 26 as discussed above.

It is readily appreciated by those skilled in the art that modifications can be made to the non-limiting embodiments of the invention without departing from the concepts disclosed in the foregoing description. It is understood that various changes can be made without departing from the spirit of the invention as defined by the claimed subject matter which follows.

What is claimed is:

1. A masking device for exposing a major surface of a window mount for painting while preventing other surfaces of the window mount from being painted, the masking device comprising:
   a support plate having a first surface and a perimeter;
   a plurality of vertical upright pins having a first end and an opposite second end, wherein the first end of the plurality of upright pins are mounted in the first surface of the support plate with the second end of the upright pins extending away from the first surface of the support plate and the plurality of upright pins spaced from the perimeter of the support plate and spaced from one another, and
   a frame member having a plate member completely surrounding an open area, wherein the plate member is supported on the second end of the plurality of upright pins, wherein with the window mount positioned within the plurality of upright pins and the plate member of the frame member positioned on the second end of the plurality of upright pins, a paint spray passing through the open area of the frame member sprays paint on the major surface of the window mount facing the open area of the frame member and passes through the space between the plurality of upright pins to prevent overspray of the other surfaces of the window mount from being painted.

2. The masking device according to claim 1 comprising a hinge having a first section pivotally connected to a second section, the first section of the hinge connected to the support plate and the second section of the hinge connected to the frame member defined as a mask cover to provide for movement of the support plate and the mask cover toward and away from one another, wherein the masking device is in the closed position when the masking cover is supported on the second end of the plurality of upright pins and the masking device is in the open position when the masking cover is spaced from the second end of the plurality of upright pins.

3. The masking device according to claim 2 comprising a locking arrangement connected to the support member and the mask cover to maintain the masking device in the closed position.

4. The masking device according to claim 3 wherein the locking arrangement is a magnetic locking arrangement having a positive or negative magnetic bar defined as a polarized first part secured to the mask and a negative or positive, respectively, magnetic bar defined as an opposite polarized second part secured to the support plate.

5. The masking device according to claim 4 wherein the plurality of upright pins have a predetermined height measured from the first surface of the support plate to the second end of the plurality of upright pins and the first hinge section comprises a plate pivotally mounted to the second section and a shim having a first end secured to the first surface of the support plate and an opposite second end with the plate of the first hinge section of the hinge secured to a surface of the shim between the first and the second ends of the spacer block, wherein height of the shim measured from the first end to the second end is about equal to the predetermined height of the upright pins.

6. The masking device according to claim 5 wherein the mask cover has a first surface and an opposite second surface wherein when the mask device is in the closed position, the first surface of the mask cover is in contact with the second end of the plurality of upright pins and the second hinge section of the hinge is secured to the second surface of the mask cover.

7. The masking device according to claim 6 wherein the window mount is a window foam mount and the predetermined height of the plurality of upright pins is greater than the thickness of the window foam mount to be spray painted such that the paint spray can move between the window foam mount and the mask cover, and through the space between the plurality of upright pins.

8. The masking device according to claim 7 wherein the predetermined height of the plurality of upright pins is greater than the thickness of the window foam mount to be spray painted by an amount in the range of greater than 0 to 10%.

9. The masking device according to claim 8 wherein selected components of the masking device are made of metal.

10. The masking device according to claim 2 wherein the plurality of upright pins have a predetermined height measured from the first surface of the support plate to the second end of the plurality of upright pins and the first hinge section comprises a plate pivotally mounted to the second section of the hinge and a shim having a first end secured to the first surface of the support plate and an opposite second end with the plate of first section of the hinge secured to a surface of the spacer block between the first and the second end of the shim, wherein height of the shim measured from the first end to the second end is about equal to the predetermined height of the upright pins.

11. The masking device according to claim 10 wherein the mask cover has a first surface and an opposite second surface wherein when the mask device is in the closed position, the first surface of the mask cover is in contact with the second end of the plurality of upright pins and the second section of the hinge is secured to the second surface of the upright pins.

12. The masking device according to claim 11 wherein the predetermined height of the plurality of upright pins is greater than the thickness of the foam mount to be spray painted such that the paint spray can move between the foam mount and the mask cover, and through the space between the plurality of upright pins.

13. The masking device according to claim 12 wherein the predetermined height of the plurality of upright pins is greater than the thickness of the foam mount to be spray painted by an amount in the range of greater than 0 to 10%.

\* \* \* \* \*